US 6,699,056 B2

(12) United States Patent
He et al.

(10) Patent No.: US 6,699,056 B2
(45) Date of Patent: Mar. 2, 2004

(54) ELECTRICAL CONNECTOR WITH OPERATION LEVER POSITIONING CONFIGURATION

(75) Inventors: Wen He, Kunsan (CN); Hui Ye, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/376,473

(22) Filed: Feb. 27, 2003

(65) Prior Publication Data

US 2004/0005801 A1 Jan. 8, 2004

(30) Foreign Application Priority Data

Jul. 4, 2002 (TW) ...................................... 91210182 U

(51) Int. Cl.[7] ............................................ H01R 13/625
(52) U.S. Cl. ...................................... 439/342; 439/259
(58) Field of Search ................................. 439/342, 259, 439/263, 264, 265, 266

(56) References Cited

U.S. PATENT DOCUMENTS

| 5,057,031 A | * | 10/1991 | Sinclair ....................... 439/261 |
| 5,489,218 A | * | 2/1996 | McHugh ....................... 439/342 |
| 5,679,020 A | * | 10/1997 | Lai et al. ..................... 439/342 |
| 5,722,848 A | * | 3/1998 | Lai et al. ..................... 439/342 |
| 6,419,514 B1 | * | 7/2002 | Yu .............................. 439/342 |
| 6,471,536 B1 | * | 10/2002 | Chen et al. .................. 439/342 |

OTHER PUBLICATIONS

U.S. patent application Ser. No. 10/375,955, Yu. Filing date N/A.

* cited by examiner

Primary Examiner—P. Austin Bradley
Assistant Examiner—Briggitte R Hammond
(74) Attorney, Agent, or Firm—Wei Te Chung

(57) ABSTRACT

An electrical connector (1) for electrically connecting an electronic package with a circuit substrate. The connector includes a base (2), a cover (3) slidably attached on the base, and an actuation device (4) for actuating the cover to slide along the base. The actuation device includes a camshaft and an operation lever (41). The camshaft is rotatably positioned between the base and the cover, and defines a locating recess (431) therein. The base includes a main portion (22) and a front portion (21). The front portion defines an engaging surface (23) for engaging with the cover. A locating slot is defined at the engaging surface, rotatably locating the camshaft of the actuation device therein. The front portion forms a locating block (25) in the slot. The locating block engages with the camshaft at the locating recess, to help prevent the operation lever from being over-rotated in either of opposite directions.

7 Claims, 3 Drawing Sheets

200~~~~~~~~~~~~~~~~~~~~~~~~~~~~~~~~~~~~~~~~~~~~~~~~~~~~~~~~

ELECTRICAL CONNECTOR WITH OPERATION LEVER POSITIONING CONFIGURATION

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to an electrical connector having an operation lever accurately and safely positioned at respective limits of its range of movement.

2. Description of Prior Art

Electrical connectors ate widely used in personal computer (PC) systems for electrically connecting electronic packages such as CPUs with circuit substrates such as PCBs. Typical such electrical connectors are known as CPU sockets. A typical CPU socket comprises a base soldered to and electrically connected with the PCB, a cover slidably mounted on the base and having a CPU attached thereon, and an actuation device for actuating the cover to slide along the base.

The CPU has a multiplicity of pins depending from a bottom surface thereof and arranged in a rectangular array. The cover of the CPU socket has a multiplicity of through holes arranged in a rectangular array corresponding to the pins of the CPU. The base of the CPU socket has a multiplicity of passageways arranged in a rectangular array and also corresponding to the pins of the CPU. Each passageway receives an electrical terminal therein.

In use, the CPU is attached to the CPU socket. The pins of the CPU extend through the corresponding through holes of the cover and are received in the corresponding passageways of the base. The pins of the CPU do not contact the corresponding electrical terminals. Thus the CPU is attached with zero insertion force. That is, the pins of the CPU are prevented from being flexed by sudden force being applied thereto by the electrical terminals. Then, the actuation device actuates the cover to slide along the base. When the cover reaches a closed position with respect to the base, the actuation device pushes the pins of the CPU into mechanical and electrical engagement with the corresponding electrical terminals.

This kind of conventional CPU socket is detailed in "Development of a ZIF BGA Socket" (Connector Specifier Magazine, May 2000, pp.16~18). Similar kinds of CPU sockets are also disclosed in Taiwan Patent Issue Nos. 394472, 481375, 481378, 443622 and 462542.

Taiwan Patent Issue Nos. 394472, 481375, 481378, 443622 and 462542 each disclose a CPU socket comprising an actuation device positioned between a base and a cover. The actuation device comprises a camshaft for actuating the cover to slide along the base, and an operation lever extending perpendicularly from one end of the camshaft to facilitate manual handling by a user. When the CPU is attached on or removed from the CPU socket, the operation lever is rotated upwardly to a position perpendicular to the base. In this process, the operation lever is prone to be accidentally over-rotated beyond said perpendicular position. When this happens, the CPU socket may be damaged. Furthermore, when the CPU is to be engaged with terminals of the base, the operation lever is rotated downwardly to a position parallel to the base. In this process, the operation lever is prone to be accidentally over-rotated beyond said parallel position. When this happens, the CPU socket may be damaged.

A new electrical connector that overcomes the above-mentioned disadvantages is desired.

SUMMARY OF THE INVENTION

Accordingly, an object of the present invention is to provide an electrical connector for electrically connecting an electronic package such as a CPU with a circuit substrate such as a PCB, whereby the electrical connector is configured so that an operation lever thereof can be accurately and safely positioned at respective limits of its range of movement.

To achieve the above-mentioned object, an electrical connector in accordance with a preferred embodiment of the present invention is for electrically connecting a CPU with a PCB. The electrical connector comprises a generally rectangular insulative base, a cover slidably attached on the base, and an actuation device for actuating the cover to slide along the base.

The actuation device comprises a camshaft and an operation lever. The camshaft is rotatably positioned between the base and the cover, and defines a locating recess therein. The operation lever extends perpendicularly from one end of the camshaft and is positioned substantially outside the base and the cover, to facilitate manual handling by a user. The base comprises a main portion, and a front portion integrally extending from the main portion. The main portion defines a multiplicity of receiving passageways arranged in a rectangular array. Each passageway receives an electrical terminal therein, and the electrical terminals are electrically connected with the PCB. The front portion defines an engaging surface for engaging with the cover. A locating slot is defined at the engaging surface, rotatably locating the camshaft of the actuation device therein. The front portion forms a locating block in the slot. The locating block engages with the camshaft at the locating recess, to help prevent the operation lever from being over-rotated in either of opposite directions.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figures 1, 2:
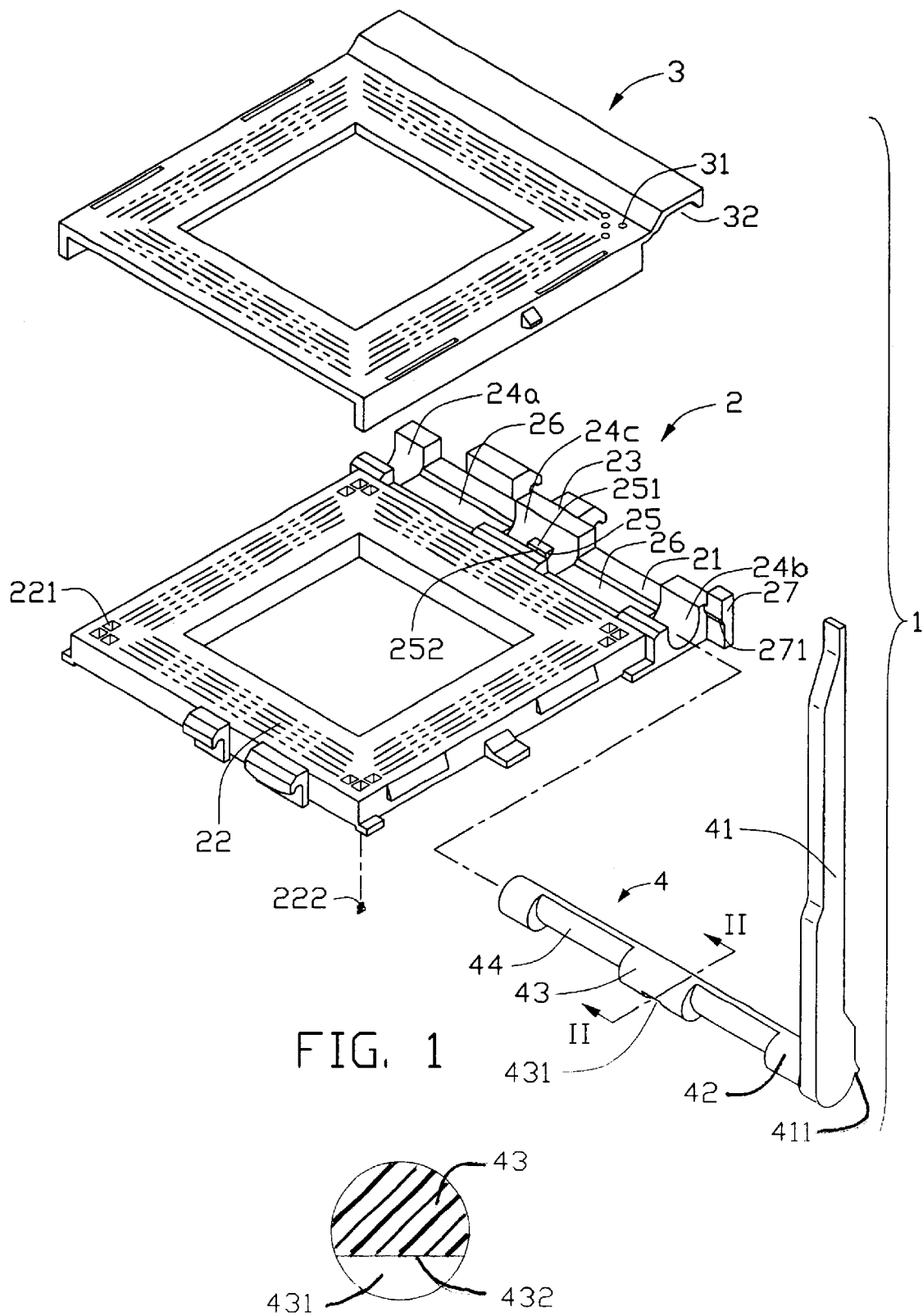
FIG. 1 is an exploded, isometric view of an electrical connector in accordance with a preferred embodiment of the present invention, the electrical connector comprising a cover, a base and an actuation device.
FIG. 2 is an enlarged, cross-sectional view of the actuation device of FIG. 1, taken along line II—II of FIG. 1.

Referring to FIGS. 1 and 2, an electrical connector 1 in accordance with a preferred embodiment of the present invention is for electrically connecting a CPU (not shown) to a PCB (not shown). The electrical connector 1 comprises a generally rectangular insulative base 2, a cover 3 slidably attached on the base 2, and an actuation device 4 positioned between the base 2 and the cover 3 for actuating the cover 3 to slide along the base 2.

The actuation device 4 comprises a camshaft positioned between the base 2 and the cover 3, and an operation lever 41. The operation lever 41 extends perpendicularly from one end of the camshaft, and is positioned substantially outside the base 2 and the cover 3 to facilitate manual handling by a user. The camshaft comprises a pair of supporting portions 42 at opposite ends thereof, a pair of actuating portions 44 adjacent the supporting portions 42, and a central locating portion 43 between the actuating portions 44. The supporting portions 42 are columnar. The locating portion 43 defines a locating recess 431 in a middle thereof. The locating portion 43 at the locating recess 431 defines a locating wall 432. The locating wall 432 is parallel to a central axis of rotation of the camshaft. A protrusion 411 is formed on a proximal end of the operation lever 41.

The base 2 comprises a main portion 22, and a front portion 21 integrally extending from the main portion 22. The main portion 22 defines a multiplicity of receiving passageways 221 arranged in a rectangular array. Each passageway 221 receives an electrical terminal 222 therein, and the electrical terminals 222 are electrically connected with the PCB. The front portion 21 defines an engaging surface 23 movably engaged with the cover 3. A locating slot is defined at the engaging surface 23, rotatably locating the camshaft of the actuation device 4 therein. The front portion 21 forms a first receiving portion 24a and a second receiving portion 24b at respective opposite ends of the locating slot, a central third receiving portion 24c between the first and second receiving portions 24a, 24b, and a pair of actuating portions 26 respectively between the first and third receiving portions 24a, 24c and between the second and third receiving portions 24b, 24c.

The third receiving portion 24c forms a locating block 25 at a side thereof distal from the main portion 22, for complementarily engaging in the locating recess 431 of the actuation device 4. The locating block 25 comprises a top horizontal first retaining surface 251 and a vertical second retaining surface 252, both of which are parallel to the central axis of rotation of the camshaft of the actuation device 4. The front portion 21 outwardly forms a retaining block 27 from one end thereof having the second receiving portion 24b. The retaining block 27 comprises a retaining portion 271, for engaging with the protrusion 411 of the operation lever 41.

The cover 3 defines a multiplicity of through holes 31 arranged in a rectangular array corresponding to the receiving passageways 221 of the base 2, and a longitudinal receiving slot 32 corresponding to the locating slot of the base 2 and rotatably receiving the camshaft of the actuation device 4.

When the operation lever 41 is rotated from a position parallel to the base 2 to a position perpendicular to the base 2, the locating wall 432 of the locating portion 43 can move freely between contact with the second retaining surface 252 of the locating block 25 and contact with the first retaining surface 251 of the locating block 25. The actuation device 4 can accordingly rotate freely.

Figure 3:
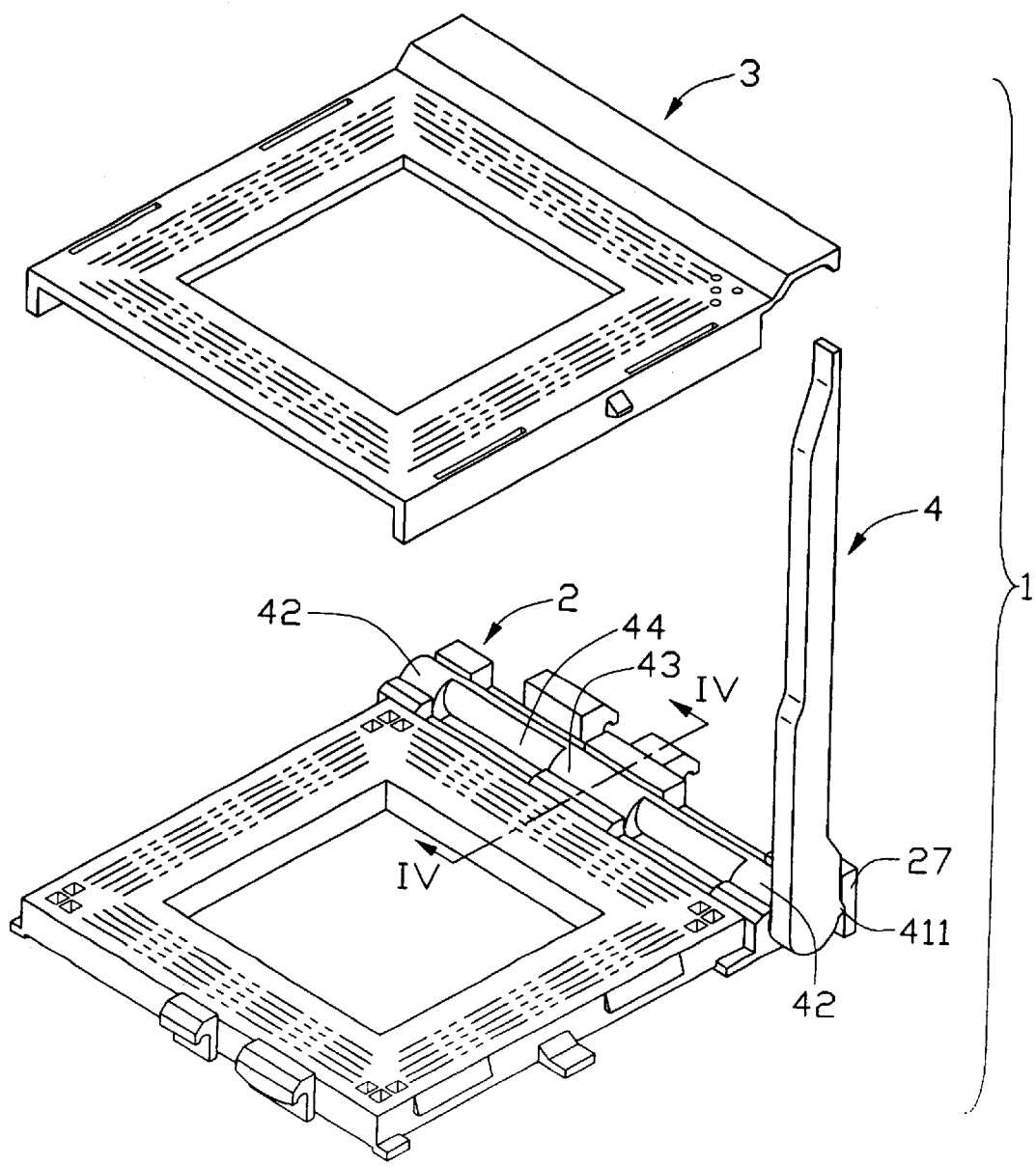
FIG. 3 is a partly assembled view of FIG. 1, showing the actuation device rotatably received in the base.
Figure 4:
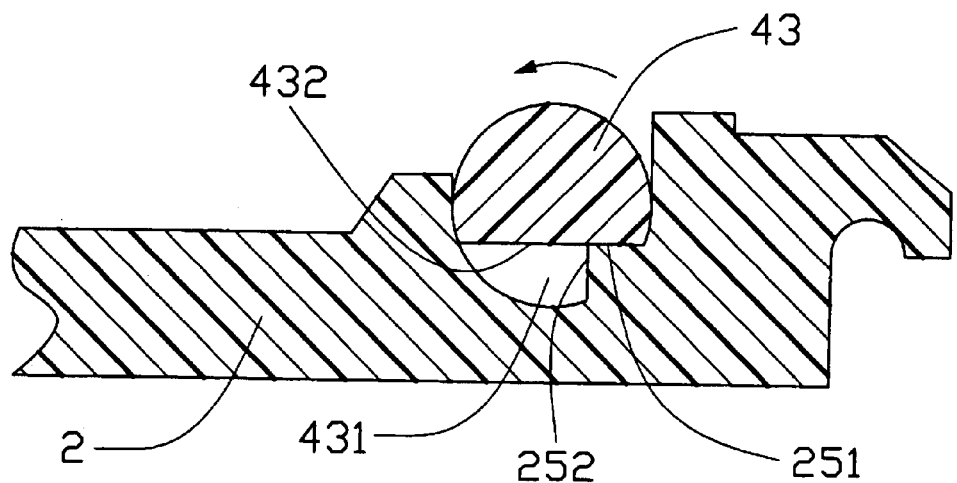
FIG. 4 is an enlarged, cross-sectional view taken along line IV—IV of FIG. 3, showing an orientation of a camshaft of the actuation device when an operation lever of the actuation device is perpendicular to the base.

Referring to FIGS. 3 and 4, when the operation lever 41 of the actuation device 4 is rotated to said perpendicular position, the protrusion 411 of the operation lever 41 engages with the retaining portion 271 of the retaining block 27. This helps retain the operation lever 41 at said perpendicular position. Simultaneously, the locating wall 432 engages with the first retaining surface 251. Thus the actuation device 4 is prevented from being over-rotated beyond said perpendicular position and causing damage to the electrical connector 1.

Figure 5:
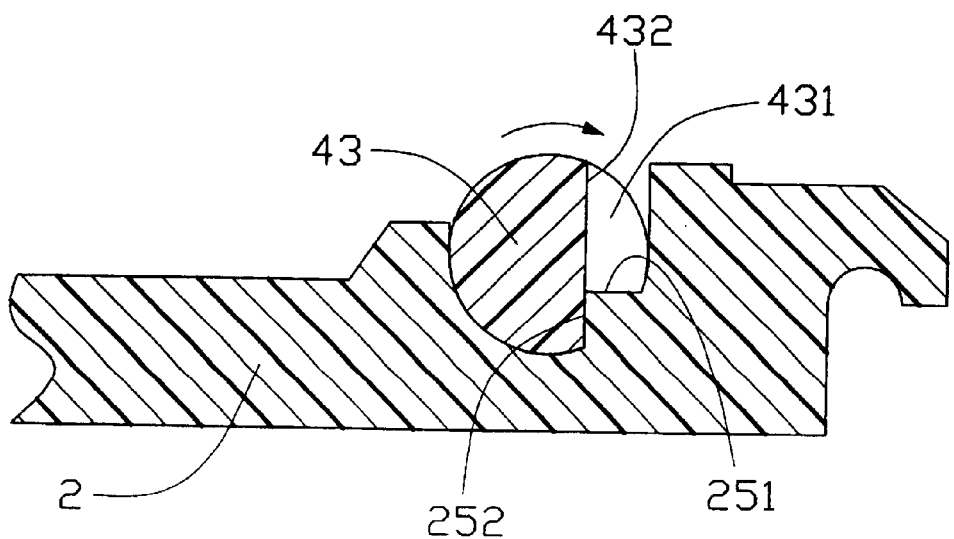
FIG. 5 is similar to FIG. 4, but showing an orientation of the camshaft when the operation lever is parallel to the base.

Referring to FIG. 5, when the actuation device 4 is rotated from said perpendicular position to said parallel position, the locating wall 432 engages with the second retaining surface 252. This prevents the actuation device 4 from being over-rotated beyond said parallel position and causing damage to the electrical connector 1.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the electrical connector comprising:

a base comprising a plurality of electrical terminals, a locating slot being defined in one end of the base;

a cover slidably attached on the base; and an actuation device comprising a camshaft rotatably positioned between the base and the cover;

wherein the camshaft of the actuation device comprises a locating recess, the base at the locating slot comprises a locating block, and the locating block engages with the camshaft at the locating recess to position the actuation device at each of two respective limits of its range of movement, wherein the camshaft of the actuation device comprises supporting portions, actuating portions and a locating portion and the locating recess is defined in the locating portion.

2. The electrical connector as claimed in claim 1, wherein a front portion of the base comprises a retaining block on one end thereof, a retaining portion is formed on the retaining block, and the actuation device comprises a protrusion engaging with the retaining portion when the actuation device is at one of the limits of its range of movement.

3. The electrical connector as claimed in claim 1, wherein the locating block is formed on a wall of the base at the slot.

4. The electrical connector as claimed in claim 2, wherein the camshaft at the locating recess comprises a locating wall parallel to an axis of rotation of the camshaft, the locating block comprises two retaining surfaces each parallel to the axis of rotation of the camshaft, and the locating wall engages with the respective retaining surfaces to position the actuation device.

5. The electrical connector as claimed in claim 3, wherein an angle between the retaining surfaces is approximately ninety degrees.

6. An electrical connector for electrically connecting an electronic package with a circuit substrate, the electrical connector comprising:

a base comprising a plurality of electrical terminals, a locating slot being defined in one end of the base;

a cover slidably attached on the base, the cover defining a retaining slot corresponding to the locating slot, the locating slot and the retaining slot cooperatively defining a retaining space; and an actuation device comprising a camshaft pivotably received in the retaining space;

wherein a locating recess is defined in the camshaft, the camshaft defines a locating wall at the locating recess, the locating wall is parallel to an axis of rotation of the camshaft, the base at the locating slot defines two retaining surfaces each parallel to the axis of rotation of the camshaft, and the retaining surfaces respectively engage with the locating wall to position the actuation device at each of two respective limits of its range of movement, wherein a wall of the base at the locating slot defines a locating block, and the retaining surfaces are defined on the locating block.

7. The electrical connector as claimed in claim 6, wherein at one of the limits of range of movement of the actuation device, the locating wall is substantially parallel to the base, and at the other of the limits of range of movement of the actuation device, the locating wall is substantially perpendicular to the base.

* * * * *